United States Patent

Yamano et al.

[11] Patent Number: 5,259,922
[45] Date of Patent: Nov. 9, 1993

[54] DRYING ETCHING METHOD

[75] Inventors: Atsuhiro Yamano, Kawanishi; Tokuhiko Tamaki, Osaka; Masafumi Kubota, Osaka; Kenji Harafuji, Osaka; Noboru Nomura, Kyoto, all of Japan

[73] Assignee: Matsushita Electric Industrial Co., Ltd., Osaka, Japan

[21] Appl. No.: 744,583

[22] Filed: Aug. 14, 1991

[30] Foreign Application Priority Data

Aug. 14, 1990 [JP] Japan .................. 2-215356

[51] Int. Cl.$^5$ ............................................. H01L 21/00
[52] U.S. Cl. ........................... 156/643; 156/646; 156/653; 156/656; 156/657; 156/662; 156/665; 204/192.32; 204/192.35; 204/192.37
[58] Field of Search ............ 156/657, 626, 627, 643, 156/646, 656, 653, 665, 662; 204/192.32, 192.35, 192.37

[56] References Cited

U.S. PATENT DOCUMENTS

| | | | |
|---|---|---|---|
| 4,158,589 | 6/1979 | Keller et al. | 156/345 |
| 4,668,366 | 5/1987 | Zarowin | 156/643 X |
| 4,798,650 | 1/1989 | Nakamura et al. | 156/643 |
| 5,110,438 | 5/1992 | Ohmi et al. | 156/643 X |

OTHER PUBLICATIONS

"Advanced Plasma Processing Equipment Without Wafer Surface Damage And Chamber Material Contamination" by H. Goto et al; Extended Abstracts of the 22nd (1980 International) Conference on Solid State Devices asnd Materials, Sendai, 1990, pp. 1147–1150.

Primary Examiner—Thi Dang
Attorney, Agent, or Firm—Lowe, Price, LeBlanc & Becker

[57] ABSTRACT

A dry etching method of a substrate or layer of a semiconductor or other material which includes the steps of providing a metallic chamber having an anode and a cathode which are spaced from each other and mounting the substrate or layer to be etched on the cathode, and applying a potential from a RF power supply to the cathode so that a plasma is generated between the anode and the cathode to produce a bulk region and sheath regions between the cathode and the anode. The frequency of the RF power supply is set at a level higher than 13.56 MHz under which the substrate or layer is subjected to etching with the ions. A polysilicon, SiN or Al alloy layer can be efficiently etched with a Cl-based etching gas.

9 Claims, 13 Drawing Sheets f = 13.56 MHz

ION ENERGY E [eV]

ION ENERGY E [eV]

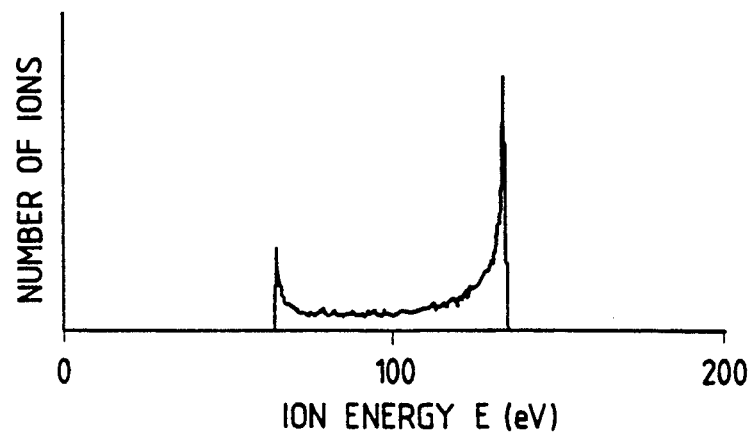
FIG. 17 PRIOR ART
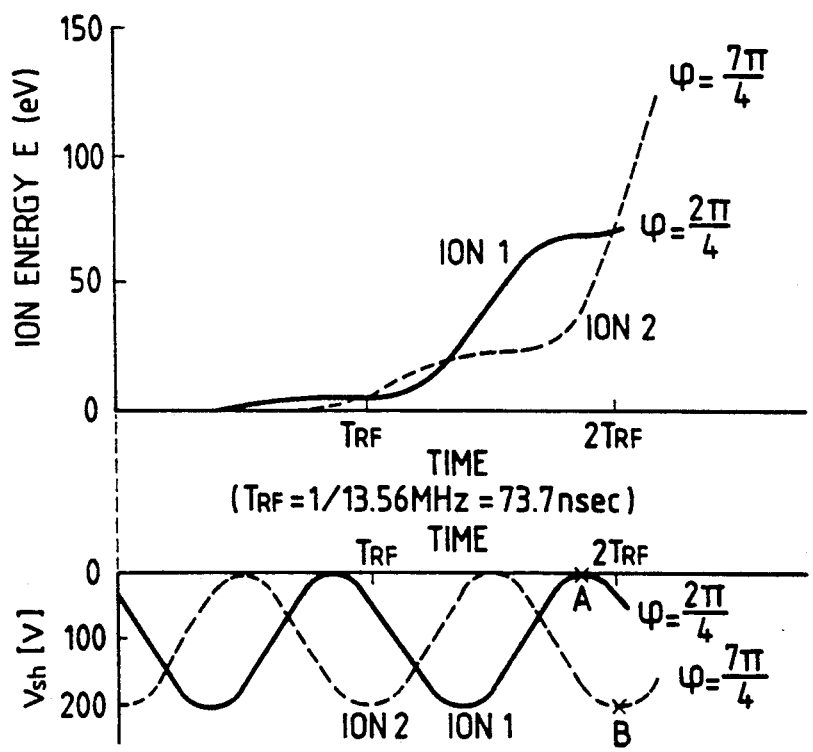
FIG. 18a
FIG. 18b

5,259,922

DRYING ETCHING METHOD

BACKGROUND OF THE INVENTION

1. Field of the Invention

This invention relates to a drying etching method and more particularly, to an improvement in the drying etching of semiconductor and other materials.

2. Description of The Prior Art

As is known in the art, the sizes or widths of transistors and wirings play an important role in the fabrication of high density semiconductor integrated circuits. By the reduction in size, a fine pattern with a size of not larger than 1 μm has now been realized. The realization of such a fine pattern depends greatly on the drastic developments of two techniques including a lithographic technique and a dry etching technique.

The drying etching technique makes use of a phenomenon where an appropriate gas is applied with a high frequency of 13.56 MHz from a RF power supply to generate a reactive plasma or radicals with which a material to be etched is etched. For the formation of a fine pattern, it is ordinary to employ a photoresist pattern as a masking material. In recent years, the RIE (reactive ion etching) technique has been predominantly used wherein a self-bias voltage ($V_{do}$) is utilized to take up a plasma from the reactive ions, thereby carrying out anisotropic etching. The reason why the frequency of the RF power supply used is 13.56 MHz is that such a frequency is one assigned to by the radio law and thus, little problem is involved if the radio frequency may be leaked, so that a simple shielding device is usable.

FIG. 10 is a schematic view of a known dry etching apparatus realizing the RIE technique. The apparatus generally indicated by A includes a metallic chamber 1 which has a feed port 2 through which a reactive gas is charged. The chamber 1 also has a discharge port 3 through which the gas is discharged. By controlling the amounts of the gas being charged and discharged, the chamber is controlled at an appropriate pressure, for example, of several hundreds mTorr. The chamber 1 has an anode 4 and a cathode 5 as shown. On the cathode 5 is mounted a material 6 to be etched which has a resist pattern (not shown) thereon. The cathode 5 is connected through a blocking capacitor 7 to a RF power supply 8 to supply electric power to the gas.

In operation, when a potential from the RF power supply 8 is applied to the reactive gas in the chamber 1, glow discharge takes place between the anode 4 and the cathode 5 as is schematically shown as in (a) of FIG. 11 to produce electrons and ions thereby generating a plasma. Since the sample is mounted on the cathode, the electrode area of the anode contacting the glow discharge becomes greater than that of the cathode. At the same time, the mobility of the electrons in the plasma is much far greater than that of the ions, so that the electrons are flown into the cathode, thereby causing the blocking capacitor to be negatively charged. Thus, the cathode is negatively biased. This bias potential is called self-bias voltage, $V_{do}$. The distribution of the potential in the plasma in this condition is schematically shown as (b) of FIG. 11. As shown in (b) of FIG. 11, the plasma is divided into a bulk region where the potential is constant and sheath regions where the potential is abruptly changed in the vicinity of the electrode owing to the self-biasing. The ions are produced mainly in the bulk region. The ions produced in the bulk region is entered from a bulk/sheath boundary into the sheath region and is accelerated with the negative potential caused by the self-biasing in the sheath region to cause the sample material to be hit and etched. This etching is anisotropic in nature and is called anisotropic etching.

The manner of producing the sheath region as a result of the generation of the negative self-bias voltage at the cathode is described in more detail.

As stated above, the mobility of the electrons generated by the glow discharge is greater than that of the ions. In general, the current-voltage characteristic in this condition is similar to that of a rectifier of the type where a leakage current is great. When the potential from the RF power supply is applied to the cathode, the electrons having a greater mobility are passed in great numbers toward the cathode with the positive potential at the positive half cycle of the frequency. The ions with a smaller mobility are flown only in small numbers toward the cathode whose potential is rendered negative at the next half cycle. Thus, the electrons and the ions do not reach the equilibrium in number. This results in the negative charge of the blocking capacitor, so that spatial charges of the electrons are produced in the cathode and a negative potential is produced in the cathode until the electrons are repulsed, with a reduction in number of excess electrons. In this manner, after several cycles, the number of electrons entering the cathode becomes equal to that of the ions entering the cathode. A negative bias potential is produced at the cathode so that the net current becomes zero on the time average, thus leading to a stationary state. This potential is called self-bias. Owing to the existence of the self-bias, the region where little electrons exist with the existence of the ions alone is formed in the vicinity of the cathode. This region is called the sheath region in which the potential is abruptly changed.

On the other hand, since the electrons tend to be diffused outside in the plasma, they are apt to be deficient in number. Hence, the potential becomes slightly positive. This potential is called plasma potential ($V_p$). The change of the cathode potential in this state in relation to the variation in time is shown in FIG. 12. FIG. 12 demonstrates that during the positive cycle wherein the potential is greater than the plasma potential, $+V_p$, the electrons are passed into the cathode and during a negative cycle where the potential is smaller, the ions are moved. However, a time at which only the ions are moved is very long and the etching reaction takes place by the action of the ions passed into the cathode.

Goto et al proposed a novel dry etching apparatus as is particularly shown in FIG. 13 (SSDM, 1990, pp. 1147–1150). In the figure, like reference numerals indicate like members or parts as in FIG. 10. In this apparatus, RF power supplies 8 and 12 are connected not only to the cathode, but also to the anode, respectively. The frequency from the RF power supply at the cathode side is controlled at 10 to 50 MHz and the frequency from the RF power supply at the anode side is as high as 150 to 200 MHz. The RF power supply at the anode side is used for the generation of plasma, like ECR and MERIE, by which power of about 1 kW is supplied to produce a plasma with a high degree of ionization. On the other hand, the RF power supply provided at the side of the cathode is to attract the ions. More particularly, the RF power supply serves to attract the ions necessary for etching from the plasma produced by means of the RF power supply at the side of the anode.

An increasing degree of integration of semiconductor is now requiring fine processing techniques wherein semiconductors are processed on the order of submicrons. In this connection, however, known etching techniques involve the problem that the reduction in size of transistors invariably entails a thin gate oxide film of transistors, so that the gate oxide film is liable to undergo dielectric breakdown during the course of drying etching. The reason for this is considered as follows: when the RIE apparatus is used for etching, anisotropic etching is effected by means of the accelerated ions and charge-up takes place during the etching; and a voltage applied to the gate oxide film is made greater, exerting a stress on the film. Especially, gate oxide films of chips around a wafer is liable to undergo the breakdown. In addition, with known etching techniques, bombardment of high energy ions against a silicon substrate will cut the bonds of the substrate, thereby degrading the element. Moreover, if $Cl_2$ gas is used, for example, for the dry etching of a gate electrode, the resultant radical component should not substantially take part in the etching of $SiO_2$ film. Nevertheless, a selection ratio of a polysilicon gate and a $SiO_2$ underlayer is, at most, about 10:1 owing to the presence of the high energy ions. Thus, this technique is not suitable for etching of the gate polysilicon.

In order to reduce damages of materials to be etched due to the charge-up of the ions so that dielectric breakdown of the gate oxide film is suppressed from occurring, it is sufficient to prevent generation of the high energy ions. For the suppression of the high energy ions, it is effective to lower the RF power. However, the lowering of the RF power results in the lowering in degree of ionization of the plasma, thereby causing the radicals to be reduced in number. This eventually leads to a lowering of the etching rate with a poor efficiency. In the Goto et al apparatus, this is solved by the provision of a RF power supply at the side of the anode. This apparatus is so designed that while the power of the RF power supply at the side of the anode is increased to about 1 KW to maintain plasma-generating conditions, the radicals are not reduced when the RF power at the side of the cathode is decreased. As will be appreciated from the above, in the Goto et al apparatus, a semiconductor substrate is etched at a low energy by taking up the ions from the plasma, which is produced by means of the high power supply provided at the side of the anode, by the use of a sheath electric field produced from the low RF power supply at the side of the anode.

However, the Goto et al apparatus has the following problem to solve. In general, the arrival energy distribution of the ions to a substrate electrode is so wide as a saddle-shaped distribution, as shown in FIG. 14a, which has a central point of the energy obtained by acceleration of the ions by self-biasing. In the Goto et al apparatus, the power from the RF power supply at the side of the cathode is lowered to decrease the self-bias so that the ion energy distribution is, as a whole, shifted toward a lower energy side as is shown in FIG. 14b. In this arrangement, if a gate electrode is etched, for example, the ion energy dependence of the etching rate between the polysilicon to be etched and the $SiO_2$ underlayer is as shown in FIG. 15. From FIG. 15, it will be seen that when the ion energy is in the range of about 50 to 60 eV as shaded in the figure, the selection ratio is high and the etching rate of the polysilicon is great, so that the etching can be efficiently carried out. However, when the ion energy is higher than 60 eV, the etching rate of $SiO_2$ becomes great with a poor selection ratio. On the contrary, when the ion energy is lower than 50 eV, the etching rate of the polysilicon becomes so small that the etching does not proceed efficiently and the anisotropy becomes poor. In the energy distribution of FIG. 14b obtained by the Goto et al apparatus, the average arrival energy is small enough to suppress damages of the substrate. However, since the width, $\Delta E$, of the energy distribution is not so small. Accordingly, the apparatus is not so improved in the selectivity, anisotropy and etching efficiency. In addition, the Goto et al apparatus is disadvantageous in that it requires two power supplies and two matching boxes with a difficulty in matching.

The frequency from the RF power supply is considered to be other factor for producing high energy ions. If the frequency of the RF power supply is so low as 13.56 MHz as has been currently employed, the self-bias becomes large and the width of the arrival energy distribution of the ions to substrate also becomes large, eventually leading to the generation of the high energy ions. In contrast, when the frequency of the RF power supply is made high, the self-bias is made small simultaneously with a narrow distribution of the ion energy as is shown in FIG. 14c. Thus, it becomes possible to suppress the generation of the high energy ions. This entails not only a reduced damage of the substrate, but also realization of dry etching with high selectivity, anisotropy and etching efficiency.

SUMMARY OF THE INVENTION

It is accordingly an object of the present invention to provide a drying etching method of semiconductor and other materials which can solve the problems involved in prior art methods and apparatus and wherein materials to be etched suffer little damages owing to the charge-up of ions from a plasma and can be etched at a selectivity inherent to the chemical reaction of a gas used to generate ions.

It is another object of the invention to provide a dry etching method of semiconductor and other materials in a desired pattern in an efficient manner while suppressing generation of high energy ions and keeping a narrow width of an ion energy distribution.

It is a further object of the invention to provide a dry etching method of a semiconductor substrate having a gate oxide film whereby the damage of the substrate is suppressed along with the breakdown of the gate oxide film.

It is a still further object of the invention to provide a dry etching method of polysilicon, SiN or Al alloy on a $SiO_2$ underlayer film at a great selection ratio between the polysilicon, SiN or Al alloy and the $SiO_2$ film while lowering the etching rate of the $SiO_2$ underlayer film.

According to one embodiment of the invention, there is provided a dry etching method of a substrate which comprises the steps of:

providing a metallic chamber having an anode and a cathode which are spaced from each other and mounting a substrate to be etched on the cathode;

applying a potential from a RF power supply to the cathode at a frequency of the RF power supply of not less than 13.56 MHz so that a plasma is generated between the anode and the cathode; and subjecting the substrate to etching with ions in the plasma.

When the frequency of the RF power supply higher than 13.56 MHz is used as defined above, the self-bias of the plasma is lowered without lowering the potential of the RF power and a width of an energy distribution of ions incident on the semiconductor substrate is narrowed. Preferably, the frequency of the RF power supply should be not smaller than 100 MHz and a maximum arrival energy of the ions at the substrate should be not larger than 100 eV.

In accordance with another embodiment of the invention, there is also a dry etching method of a polysilicon, SiN or Al alloy layer which comprises the steps of:

providing a metallic chamber having an anode and a cathode which are spaced from each other and mounting a polysilicon, SiN or Al alloy layer to be etched on the cathode;

feeding an etching gas at a reduced pressure of not larger than 100 mTorr.; and applying a potential of a RF power supply at a frequency of not lower than 100 MHz to the cathode so that a plasma is generated between the anode and the cathode in such a way that a maximum arrival energy of ions to the substrate is suppressed to a level of not larger than 100 eV and a width of an energy distribution of not larger than ±5% of the average arrival energy of the ions at the layer; and subjecting the layer to etching with the ions.

In this embodiment, it is preferred to use a chlorine-based gas such as $Cl_2$, HCl, $SiCl_4$ or the like as an etching gas. Of these, chlorine gas is most preferred.

In accordance with a further embodiment of the invention, there is provided a dry etching method of a substrate which comprises the steps of:

providing a metallic chamber having an anode and a cathode which are spaced from each other and mounting a substrate to be etched on the cathode;

applying a potential from a RF power supply to the cathode so that a plasma is generated between the anode and the cathode to produce a bulk region and sheath regions between the cathode and the anode wherein a frequency of the RF power supply is not less than a value of $f_{RF}=683/(M^{\frac{1}{2}} L_{sh})$, wherein M represents a mass by amu of an etching gas, $L_{sh}$ represents a sheath length by mm, and $f_{RF}$ represents a frequency of the RF power supply by MHz; and subjecting the substrate to etching with ions from the plasma. Preferably, the frequency should be not smaller than 36 MHz when Ar gas is used as the etching gas and not smaller than 20 MHz when $SF_6$ gas is used as the etching gas whereby the width of an arrival energy distribution of the ions to the substrate can be narrowed to a level of not larger than 10 eV.

In the practice of the invention, it is essential that high energy ions be not generated. The frequency of the RF power supply is considered to be an important factor for generating high energy ions as well as the RF power. If the frequency of the RF power supply is so low as 13.56 MHz as has been currently employed, the self-bias becomes large and the width of an arrival energy distribution of the ions to substrate also becomes large, thus leading to the generation of the high energy ions. In contrast, when the frequency of the RF power supply is made high, the self-bias is made small simultaneously with a narrow distribution of the ion energy as is shown in FIG. 14c. Thus, it becomes possible to suppress the generation of the high energy ions. This entails not only a reduced damage of the substrate, but also realization of dry etching with high selectivity, anisotropy and etching efficiency.

In general, when an etching gas pressure is lowered in order to enhance the anisotropy, a great self-bias results. When the self-bias is lowered by increasing the frequency of the RF power supply, it will be possible to effect dry etching at a reduced degree of damage while keeping the anisotropy.

In case of dry etching of polysilicon, SiN or Al alloys to provide, for example, a gate electrode or wiring on a silicon dioxide underlayer film as in the second embodiment of the invention, an ion energy necessary for etching the polysilicon, SiN or Al alloys is significantly smaller than an ion energy necessary for etching the underlayer film. When the frequency of the RF power supply is increased so as to suppress generation of high energy ions, the etching rate of the $SiO_2$ film is lowered to obtain a large selection ratio.

As stated above, the use of a high frequency of the RF power supply has two advantages with respect to the arrival energy of the ions at substrate. One is that since the self-bias of the plasma is lowered, the ion energy distribution is shifted toward a lower energy side as a whole, thereby not generating high energy ions. Another is that the width of the ion energy distribution is narrowed, neither lower energy ions nor higher energy ions are produced relative to a given ion energy, so that it becomes possible to control an etching rate, making it possible to efficiently etch a material to be etched.

The reason why the self-bias is lowered when the frequency of the RF power supply is increased is described below.

In general, the bulk region of the plasma produced by RF glow discharge approximates to a parallel circuit of a resistance and an inductance as shown in FIG. 16. The sheath region can approximate to a capacitor. The impedance of the sheath regions may be expressed by $1/j\omega C(\omega)$. When the frequency of the RF power supply is made high and the value of $\omega$ becomes great, the sheath length is shortened to increase the capacitance $C(\omega)$ between the sheaths. Accordingly, the impedance of the sheaths is made small, so that the voltage, i.e. the self-bias, between the sheaths is lowered at a high frequency of the RF power supply.

When the self-bias of the plasma is lowered by increasing the frequency of the RF power supply, the energy distribution of the ions arriving at the substrate is shifted toward a lower energy side as a whole, making it possible to suppress generation of high energy ions. If high energy ions are not generated, two problems involved in the dry etching can be solved. One of the problems is a problem of damaging a semiconductor or the like substrate. In the absence of high energy ions, a semiconductor substrate such as a silicon substrate is not bombarded with the ions to cause crystal defects, thereby preventing the semiconductor element from being degraded. At the same time, the charge-up can be suppressed, thereby preventing dielectric breakdown of a gate oxide film of a semiconductor element. Another problem is a problem on a selection ratio between a material to be etched and an underlayer. For etching of a gate electrode, for example, the selection ratio of a polysilicon gate and a silicon dioxide underlayer now realized by known techniques is about 10:1. However, Si—Si bonds of the polysilicon are etched only with radicals without the ion-assist, so that there is no great influence on the etching rate if the ion energy is small.

The anisotropy is ensured at an ion energy of not larger than 100 eV. In contrast, with a SiO$_2$ film, the bond energy of Si—O is so high that it cannot be etched in the absence of high energy ions. Accordingly, if high energy ions are not present, the etching rate of polysilicon is gradually reduced and the etching rate of the SiO$_2$ film is drastically reduced, leading to a great selection ratio. Thus, it will be possible to etch the polysilicon with little influence on the SiO$_2$ film.

Then, the width of the ion energy distribution in relation to the frequency of the RF power supply is described.

In FIG. 17, there is shown an ion energy distribution, which has been determined according to the Monte Carlo simulation method, at the time when the ions generated in the bulk region of a plasma reach a substrate across a sheath region. In the figure, the abscissa axis indicates the reached ion energy and the ordinate axis indicates the number of the ions. In this simulation method, the plasma-generating conditions are assumed to include an ion temperature of 300° K., a sheath length of 1.2 mm, a voltage applied to the substrate of 100 volts, a self-bias of 100 volts, and Ar gas. In addition, the frequency of a RF power supply is assumed to be 13.56 MHz which has been conventionally employed in the art. As is clearly shown in FIG. 17, the ion energy arriving at the substrate is distributed in a saddle-shaped fashion under the above frequency conditions.

The reason why the energy of the ions reached to the substrate has such a saddle-shaped distribution is described. FIGS. 18a and 19b show how the energy of the ions incident at the bulk and sheath boundary is varied with time when the ions move across the sheath region wherein FIG. 18a is the variation of the ion energy with time and FIG. 18b shows the variation of the voltage of the power supply with time. In these figures, the solid line indicates a case of Ion 1 which is incident at the bulk/sheath boundary at the moment when the phase of the RF power supply is at $2\pi/4$. The broken line indicates a case of Ion 2 which is incident at the moment of $7\pi/4$. The comparison between the arrival energies of Ions 1 and Ions 2 reveal that with Ion 1, since the potential A of the RF power supply at a final phase of arriving at the substrate is substantially zero, the ions are not accelerated and reach the substrate substantially at a given rate, so that the arrival energy is not increased. In contrast, with Ions 2, the voltage B of the RF power supply is substantially in a maximum at the final phase and the ions are greatly accelerated to make a large arrival energy.

In order to explain why there appears a great difference in the arrival ion energy depending on whether or not the ions are accelerated at the final phase, the dependence of the variation in the energy of the ions on the ion velocity and the difference in the potential of the sheath regions is shown in FIG. 19. For simplicity, as is shown in FIG. 19a, the difference in the potential between the sheaths is constant during a time, $\Delta t$, and the velocity, $v_1$, of Ion 1 is far greater than the velocity, $v_2$, of Ion 2, i.e. $v_1 >> v_2$. In this case, the distance of movement of Ion 1 during the time, $\Delta t$, is larger than that of Ion 2. The acquired energy of ions is equal to the difference in the potential between the distances in the sheath where the ions have been moved. Accordingly, Ion 1 can acquire an energy greater than Ion 2. The case, where Ions 1 and 2 are moved at the same velocity and the potential difference, $V_1$, between the sheaths of Ion 1 is far greater than the potential difference, $V_2$, between the sheaths of Ion 2 ($V_1 >> V_2$) as is shown in FIG. 19b, is described. For simplicity, it is assumed that the velocities of Ions 1 and 2 are not changed during the time, $\Delta t$, the distance of movement of Ion 1 during the time, $\Delta t$, is the same as that of Ion 2. However, since Ion 1 has a greater difference in the potential during the movement, Ion 1 has acquired a greater energy than Ion 2. Thus, the acquired energy of the ions will be determined depending on the ion velocity and the difference in the potential between the sheaths at the moment. More particularly, a larger ion velocity and a larger difference in the potential between the sheaths result in a greater energy of the ions. This means that the acquired energy of the ions becomes greater when the difference in the potential between the sheaths is greater at the final phase where the ion velocity is great, and the energy becomes smaller at a smaller difference in the potential.

Whether the ions is accelerated or not at the final phase depends on the phase of the RF power supply at the time when the ions are incident at the bulk/sheath boundary. The incidence of the ions at the bulk-sheath boundary takes place randomly. The arrival energy of the ions to the substrate is influenced by the incident phase as shown in FIG. 20, with the result that the ion energy distribution is widened in a saddle-shaped fashion as shown in FIG. 17. When the ion energy distribution is so widened as set out above, the ions at the high energy side damages the substrate and the ions at a low energy side give little contribution to etching, making it difficult to carry dry etching in an efficient manner.

However, when the frequency from the RF power supply is made higher than 13.56 MHz, the width of the ion energy distribution can be made narrower than in the case using 13.56 MHz, so that a uniform ion energy with a small width of the distribution can be obtained. This is because when the frequency of the RF power supply is made high, the ions are more accelerated by means of the RF power supply during passage through the sheaths, with the result that the arrival energy of the ions tends to be concentrated at an average value (self-bias) without suffering the incident phase of the ions. This is particularly shown in FIG. 21a. When the frequency of the RF power supply is as low as 13.56 MHz conventionally used in prior art as shown in FIG. 21a, the distance of movement of the ions accelerated during one cycle of the radio frequency becomes great. The difference of the ions in the arrival energy depends on whether the ions are accelerated at the final phase. In contrast, when the frequency is high as shown in FIG. 21b, the distance of movement of the ions accelerated during one cycle of RF becomes small, so that the difference of the ions in the arrival energy becomes so small that the ion energy with a small and uniform width of the distribution results. With the ion energy having such a small distribution width, it is possible to effect dry etching in a reduced degree of damage and in a high efficiency by controlling the ion energy at a desired level.

In the practice of the invention, the frequency of a RF power supply is broadly made higher than 13.56 MHz conventionally employed in the art to realize dry etching in a high efficiency and in a reduced degree of damage of materials to be etched while attaining high anisotropy and a great selection ratio.

BRIEF DESCRIPTION OF THE DRAWINGS

FIG. 17 is a view showing an energy distribution of $Ar^+$ ions which reach a substrate across sheaths at a frequency of 13.56 MHz;

FIGS. 18a and 18b are, respectively, graphical representations of the energy of ions incident at the bulk/sheath boundary and the potential of the sheath in relation to the variation of time;

DETAILED DESCRIPTION AND EMBODIMENTS OF THE INVENTION

Figure 1:
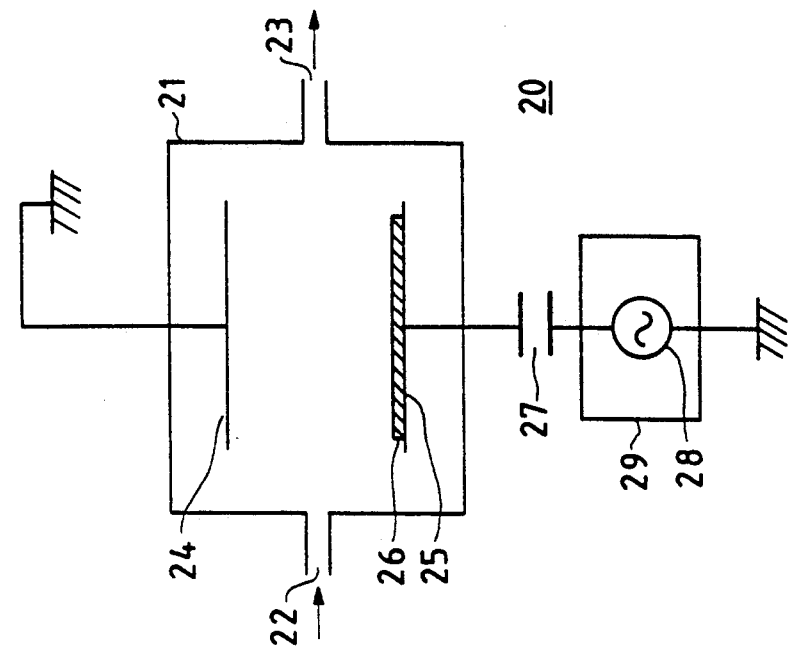
FIG. 1 is a schematic view of a dry etching apparatus having a RF power supply capable of producing a frequency higher than 23.56 MHz for carrying out the method of the invention.
Figure 13:
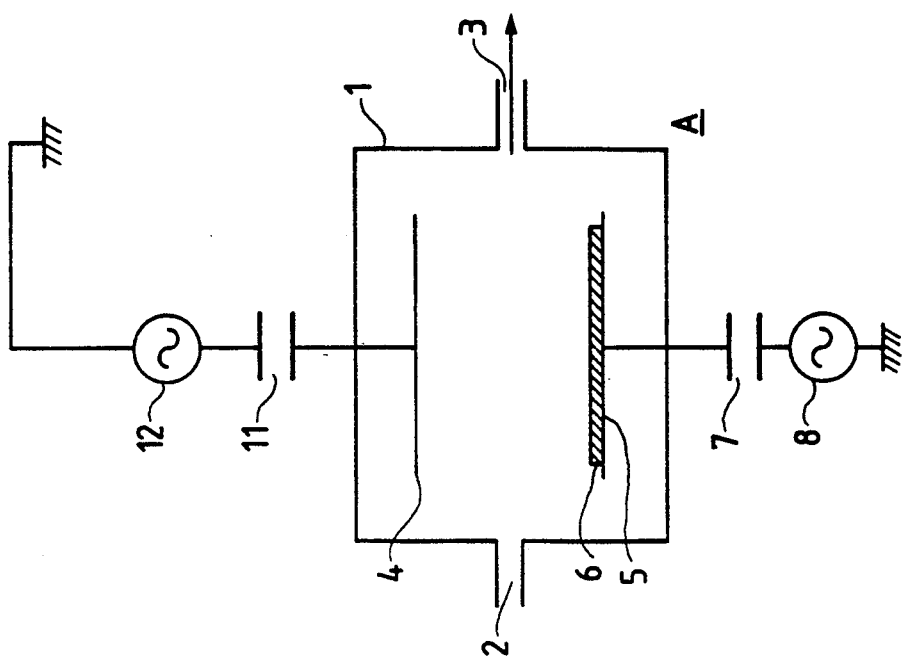
FIG. 13 is a schematic view of a two frequency excitation-type dry etching apparatus proposed by Goto et al.

Reference is now made to the accompanying drawings and particularly, to FIG. 1 in which there is shown a fundamental arrangement of a dry etching apparatus which makes use of a high frequency RF power supply and which is suitable for carrying out the method of the invention. In FIG. 1, there is generally shown a dry etching apparatus 20 which includes a metallic chamber 21 having a reactive gas charge port 22 and a discharge port 23 as shown. An anode 24 and a cathode 25 are provided in the chamber 21 in a spaced relation. A material 26 with a resist pattern (not shown) is placed on the cathode 25. The cathode 25 is connected to a RF power supply 28 through a blocking capacitor 27. When a potential is applied from the power supply 28 sufficient to ionize an etching gas in the chamber 21, a plasma is generated in the chamber 21. The fundamental arrangement of the dry etching apparatus is similar to those illustrated before with reference to FIGS. 10 and 13. In the practice of the invention, the frequency of the RF power supply 28 is one which is higher than 13.56 MHz assigned to by the radio law. To this end, a shield box 29 is used to completely cover the RF power supply 28 therewith in order not to allow leakage of the radio wave.

Figure 11:
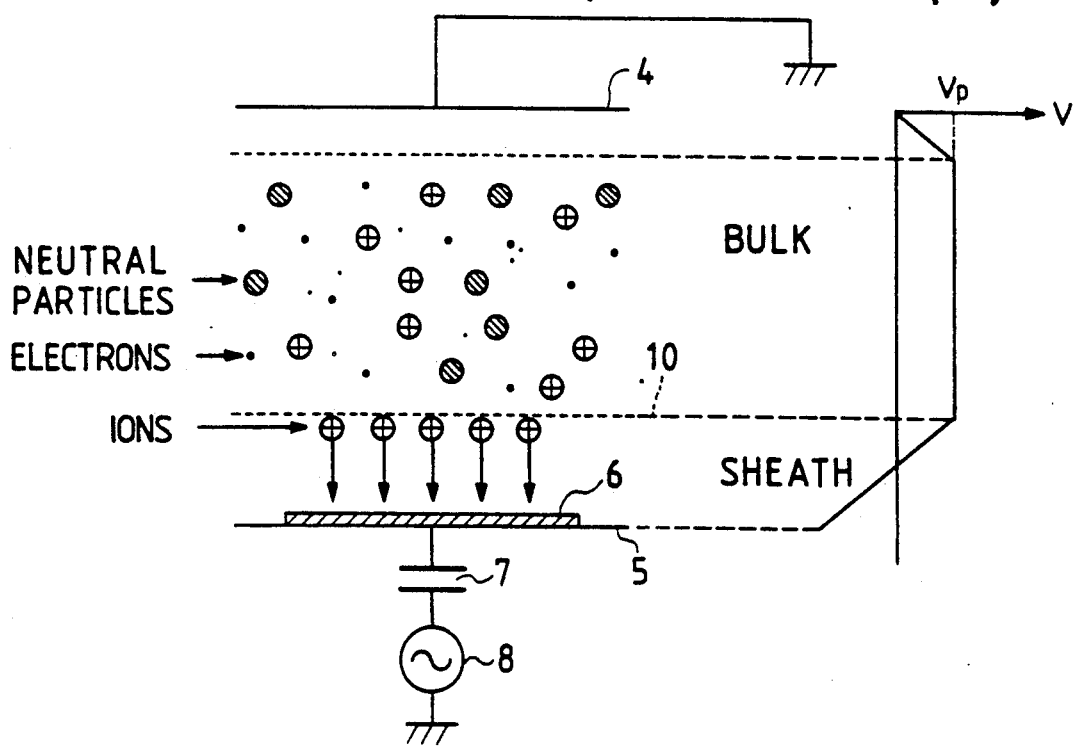
FIGS. 11a and 11b are, respectively, schematic views of a RF plasma and a potential distribution in the plasma.

In operation, when the potential from the RF power supply 28 is applied to a reactive etching gas in the chamber 28, glow discharge takes place between the anode 24 and the cathode 25 in a manner stated with reference to FIG. 11a. As a result, electrons and ions are produced to generate a plasma.

Figure 10:
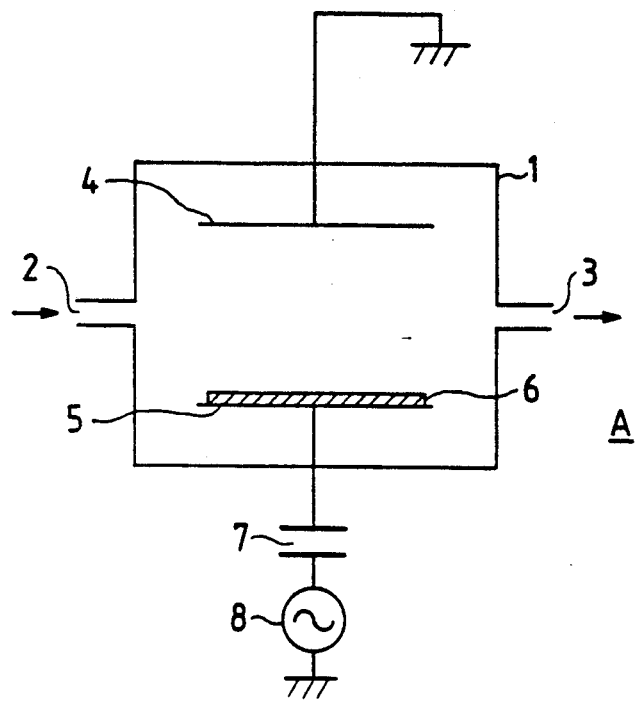
FIG. 10 is a schematic view of a known dry etching apparatus (RIE)

As stated with reference to FIG. 10, since the material 26 to be etched is mounted on the cathode, the electrode area of the anode contacting the glow discharge becomes greater than that of the cathode. At the same time, the mobility of the electrons in the plasma is much far greater than that of the ions, so that the electrons are flown into the cathode, thereby causing the blocking capacitor to be negatively charged. Thus, the cathode is negatively biased as $V_{do}$. The distribution of the potential in the plasma in this condition is as in FIG. 11b. The plasma is divided into a bulk region where the potential is constant and a sheath region where the potential is abruptly changed in the vicinity of the electrode owing to the self-biasing. The ions are produced mainly in the bulk region. The ions produced in the bulk region is entered from a bulk/sheath boundary into the sheath region and is accelerated with the negative potential caused by the self-biasing in the sheath region to cause the material to be impacted and etched. This etching is anisotropic in nature and is called anisotropic etching.

Figure 14A:
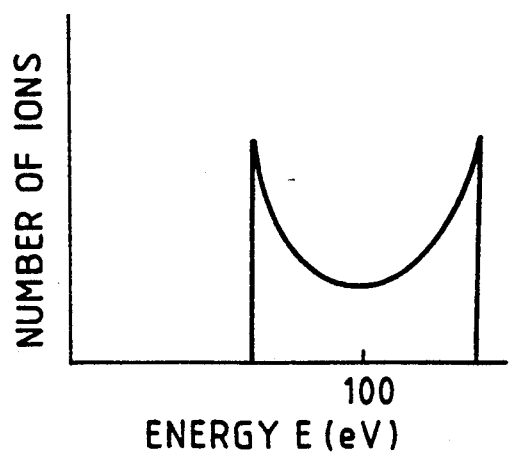
FIGS. 14a to 14c are, respectively, schematic views of an ion energy distribution attained by a known RIE apparatus, that attained by Goto et al, and that attained by a case where the frequency from a RF power supply is elevated.
Figure 14B:
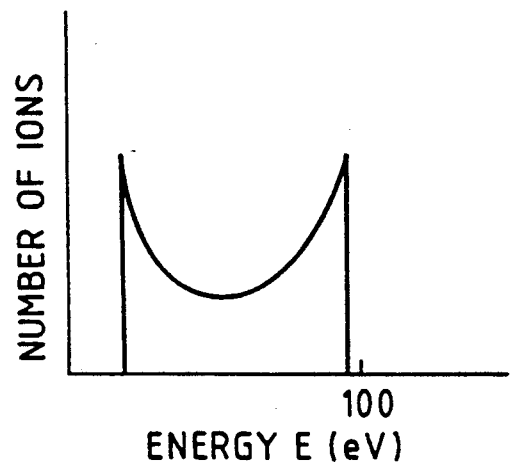
Figure 14C:
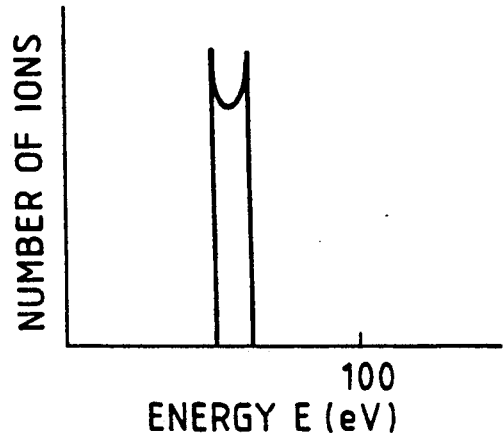
Figure 16:
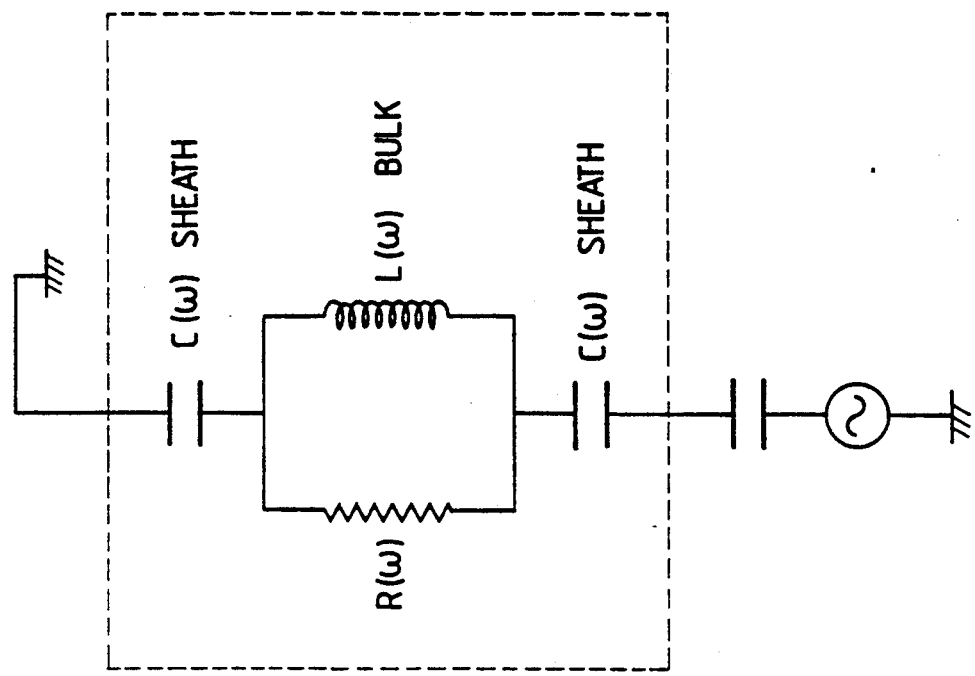
FIG. 16 is a schematic view of a circuit model of a RF plasma.
Figure 15:
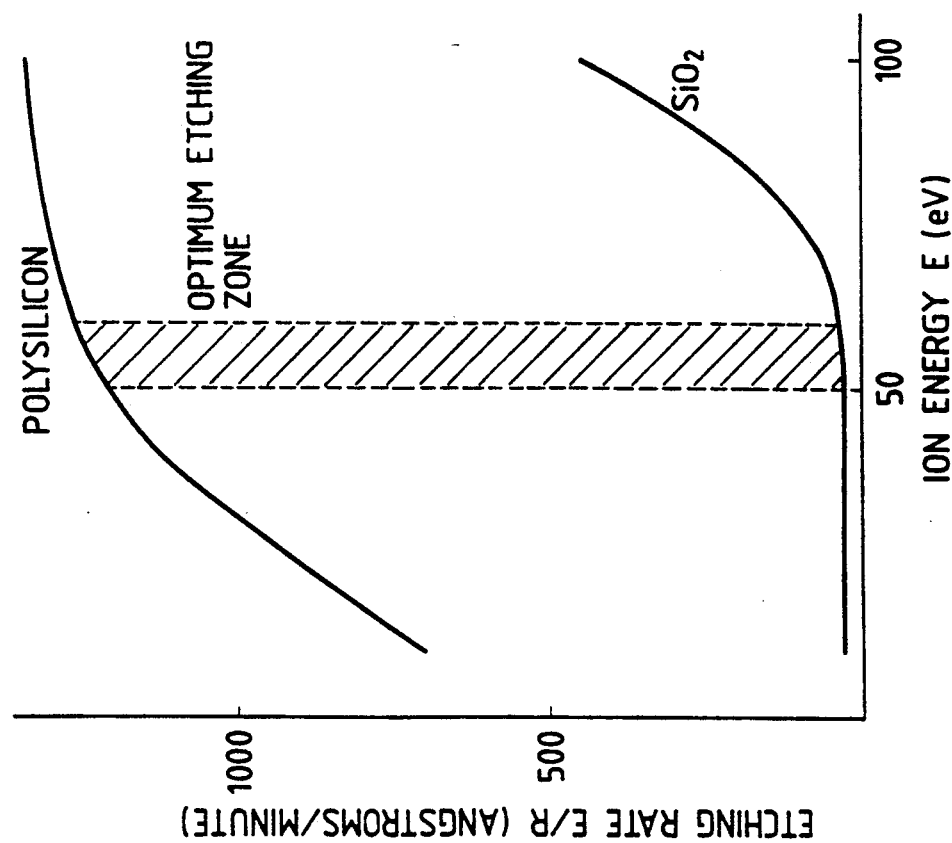
FIG. 15 is a graphical representation of the etching rates of polysilicon and $SiO_2$ in relation to the variation of ion energy.
Figure 19A:
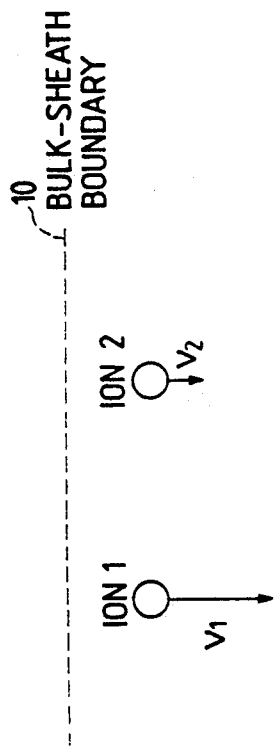
FIGS. 19a and 19b are, respectively, schematic views illustrating how the energy acquired by ions is changed depending on the ion velocity and the difference in potential between sheaths.
Figure 19B:
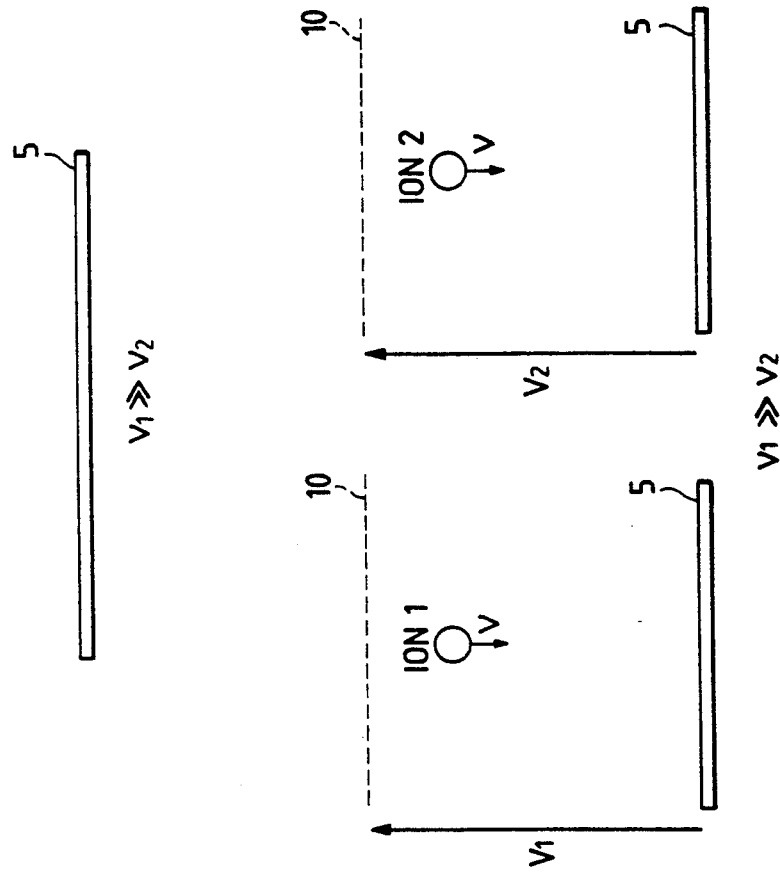
Figure 20:
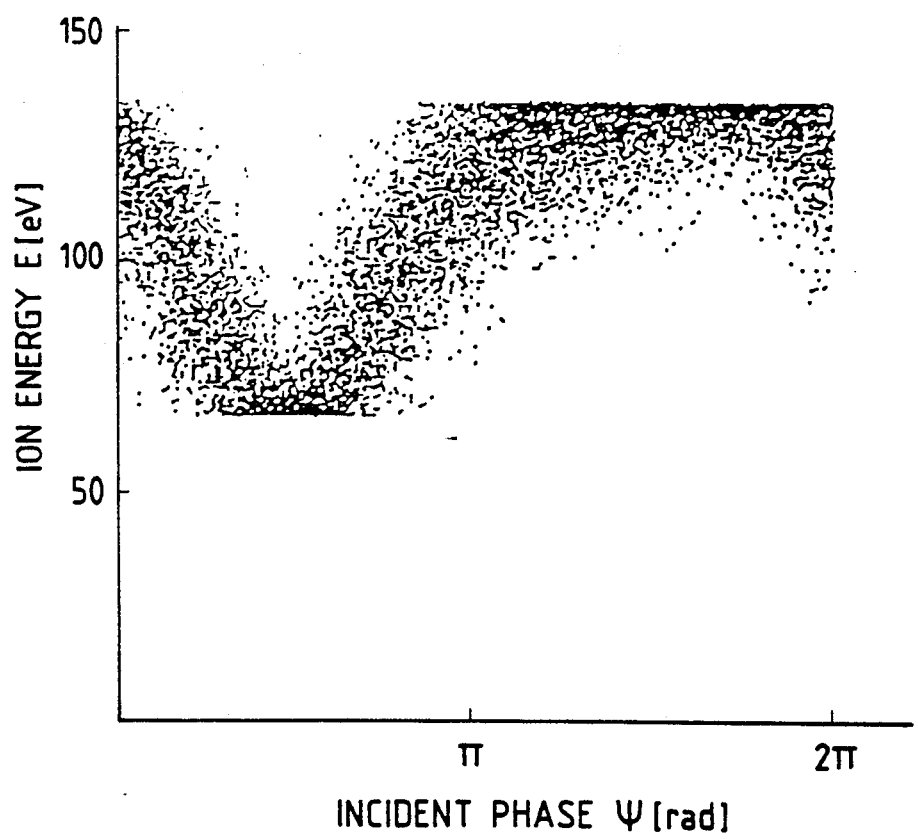
FIG. 20 is a view showing the relation between the energy of $Ar^+$ ions arrived at a substrate and the incident phase.
Figure 21A:
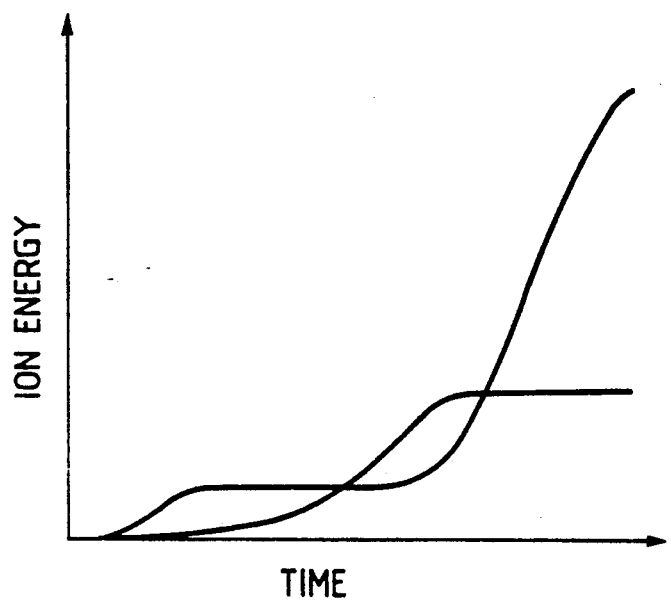
FIGS. 21a and 21b are, respectively, graphical representation of the ion energy in relation to the variation in time for different frequencies of a RF power supply.
Figure 21B:
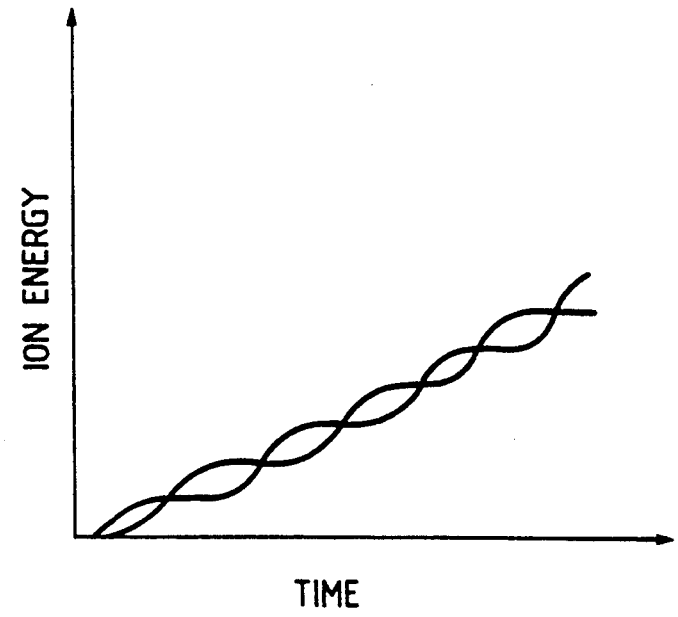

In the practice of the invention, it is essential that the frequency of the power supply be higher than 13.56 MHz. Preferably, the frequency is determined using the mass of an etching gas and a sheath length as will be discussed hereinafter. More preferably, a frequency of 100 MHz or over is used irrespective of the type or mass of etching gas. When such a frequency is used, self-bias of the plasma generated in the chamber can be lowered and the width of an energy distribution of the ions incident on the material to be etched can be made narrow as shown in FIG. 14c.

Figure 12:
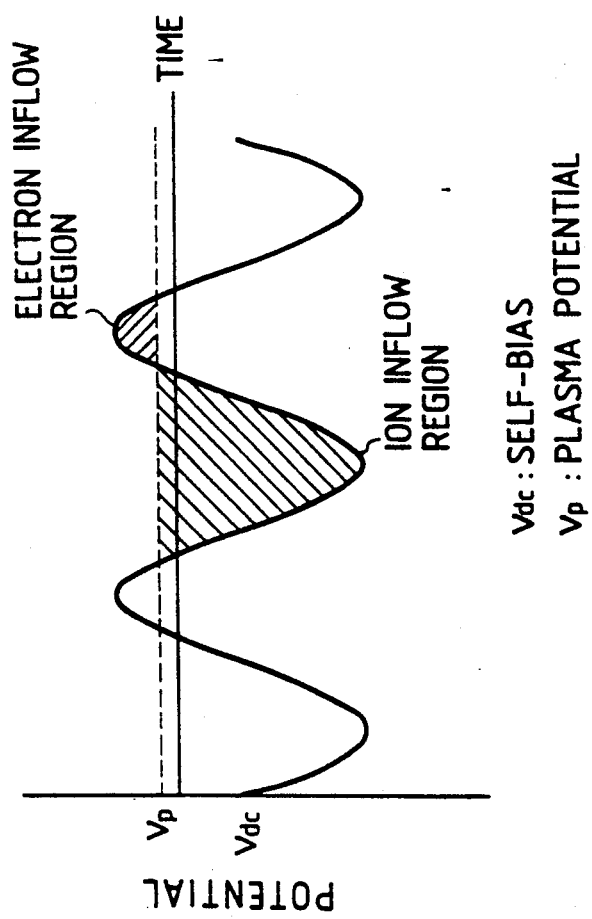
FIG. 12 is a graphical representation of the plasma potential in relation to the variation of the time with respect to a cathode potential.

Finally, the material is etched with the ions generated in the bulk region when the cathode has a potential lower than a plasma potential. At the time, the potential of the RF power supply is sinusoidally changed as shown in FIG. 12 by which the ions can be incident on the material to be etched at a low energy and the material can be etched efficiently as discussed before with reference to FIG. 12.

The etching gas useful in the present invention may be those ordinarily used in this art and includes, for example halogens such as $Cl_2$, $F_2$, $Br_2$ and $I_2$, inert gases such as Ar, He, Xe and the like, fluorine-containing gases such $SF_6$, $CF_4$, HF and the like, and chlorine-based gases such as $Cl_2$, HCl, $SiCl_4$ the like. The gas pressure in the chamber can be reduced to in the range of from 5 to 200 mTorr.

The potential applied to the cathode is not critical and should be sufficient to cause ionization of an etching gas. Although the potential may depend on the type of etching gas and the gas pressure, it is generally in the range of from 20 to 200 volts.

The materials to be etched which are suitably used according to the method of the invention may be various semiconductive materials such as polysilicon, doped polysilicon and the like, and conductive or insulating materials such as SiN, tungsten silicide, titanium silicide, Al alloys such as Al-Cu alloys, Al-Si-Cu alloys and the like.

In a more specific embodiment of the invention wherein polysilicon, SiN and the Al alloys are used as a material to be etched, when the gas pressure used is not larger than 100 mTorr., and a potential is applied to the cathode at a high frequency of not lower than 100 MHz, a plasma is generated in the chamber at a maximum arrival energy of ions suppressed to a level of not larger than 100 eV and a width of an energy distribution can be made at a level of not larger than ±5% of an average arrival energy. Accordingly, the precise and efficient dry etching is carried out with little damages on the material to be etched. In this case, it is preferred to use a chlorine-based gas such as $Cl_2$, HCl, $SiCl_4$ or the like. Of these, $Cl_2$ is more preferably used.

Moreover, the frequency of the RF power supply can be more specifically determined according to an equation of $f_{RF}=683/(M^{\frac{1}{2}}\cdot L_{sh})$, wherein M represents a mass by amu of an etching gas, $L_{sh}$ represents a sheath length by mm, and $f_{RF}$ represents a frequency of the RF power supply by MHz. When the frequency is determined according to the equation, a width of an arrival energy distribution of ions to the substrate can be made narrow at a level of not larger than 10 eV. This narrow width is effective in dry etching as set forth before particularly with reference to FIG. 14. When Ar gas is used as an etching gas, the frequency should preferably be not less than 36 MHz. Likewise, when $SF_6$ gas is used, the frequency should preferably be not smaller than 20 MHz. Thus, n optimum frequency can be determined based on the mass of an etching gas used. This equation is more particularly discussed in examples appearing hereinafter.

According to the method of the invention wherein a potential is applied at a frequency higher than conventionally employed 13.56 MHz so that self-bias is suppressed to 100 eV and a narrow width of arrival ion energy distribution is realized, high energy ions can be suppressed from generation. This leads to a reduced degree of damage of substrates to be etched and also to a reduced etching rate of oxides such as $SiO_2$ which are not intended to be etched.

The present invention is more particularly described by way of examples.

EXAMPLE 1

The dry etching apparatus of FIG. 1 was used to determine the dependence of etching rates of polysilicon for gate electrode and a $SiO_2$ film and the selection ratio between the polysilicon electrode and the $SiO_2$ film, on the frequency of the RF power supply. An etching gas used was $Cl_2$, a gas pressure was 100 mTorr., and RF power was 300 W. The reason why $Cl_2$ was used as the etching gas for the gate electrode is as follows. In Table 1, there are those bond energies of Si and other atoms. The bond energy of Si—Si is as low as 1.83 eV and the bond energy of Si—O is as high as 8.33 eV. Accordingly, F, Cl, Br and I whose bond energy with Si is intermediate therebetween may be used for etching of the gate electrode. More particularly, with Cl, the bond energy of Si—Cl is such that Si—Si<Si—Cl<Si—O. Since the bond with a higher bond energy is more stable, polysilicon is more likely to undergo etching with Cl but $SiO_2$ is difficult to be etched with Cl. In order to ensure a higher selection ratio, a gas having a bond energy which is as small as possible on comparison with the bond energy of Si—O. However, $Br_2$ and $I_2$ are disadvantageous in that they are difficult to remove as an exhaust gas and are more liable to corrode the chambers or pipes. Accordingly, $Cl_2$ was used as the etching gas.

TABLE 1

|  | Bond Energy (eV/atom) |
|---|---|
| Si-Si | 1.83 |
| Si-I | 3.05 |
| Si-Br | 3.84 |
| Si-Cl | 4.19 |
| Si-F | 5.76 |
| Si-O | 8.33 |

Under these etching conditions, the frequencies of the RF power supply were changed at 13.56 MHz, 40 MHz, 70 MHz, and 100 MHz to measure etching rates of the polysilicon and $SiO_2$ film. The results are shown in FIG. 2, revealing that when a higher frequency of the RF power supply results in a greater selection ratio.

Figure 2:
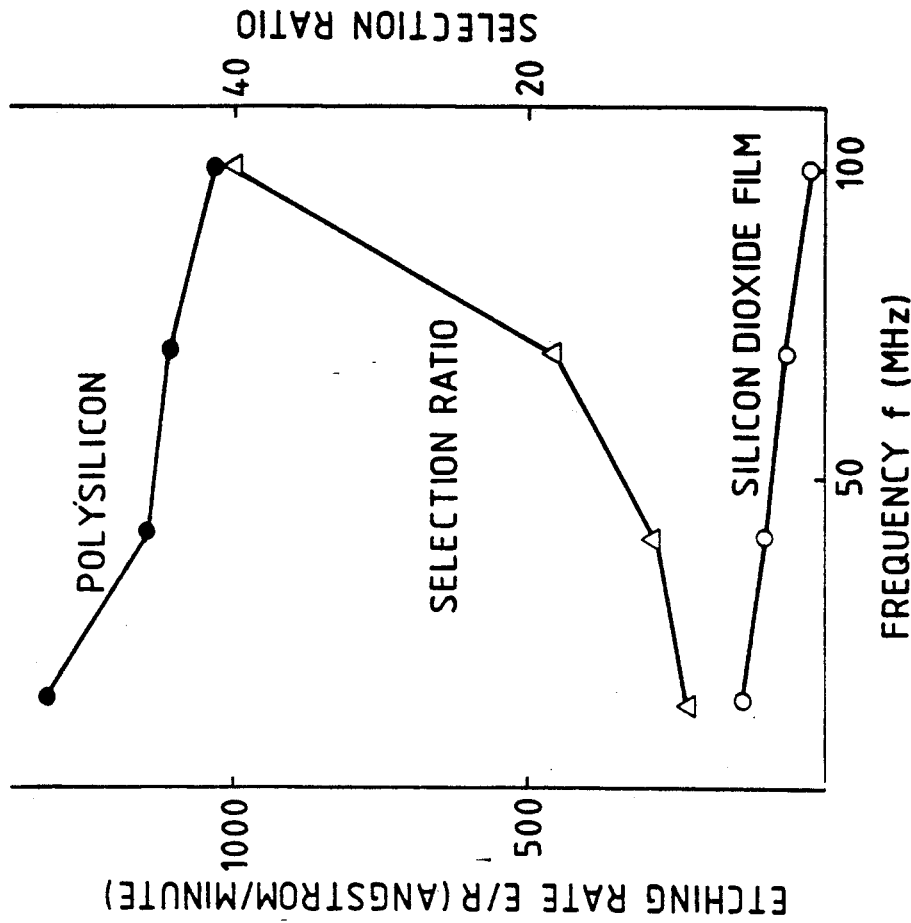
FIG. 2 is a graphical representation of etching rates of a polysilicon film and an oxide film and a selection ratio therebetween in relation to the variation of the frequency of a RF power supply.
Figure 3:
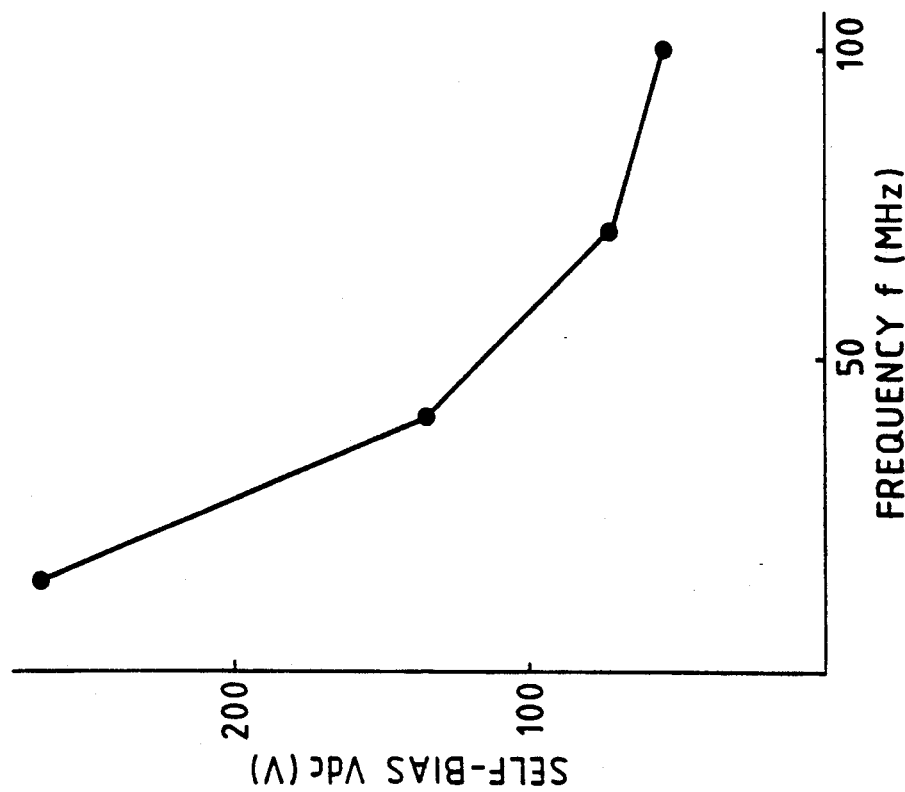
FIG. 3 is a graphical representation of the self-bias of a plasma in relation to the variation of the frequency of a RF power supply.

In FIG. 3, there is shown the self-bias in relation to the variation in the frequency, from which it will be seen that the higher selection ratio attained at a higher frequency as in FIG. 2 is considered to result from a lowering of the self-bias of the plasma at a higher frequency of the RF power supply. More particularly, the frequency of the power supply becomes high to lower the self-bias, thus leading to a lowering of the ion energy arriving at the substrate. In this condition, the polysilicon is etched with low energy ions since the Si—Si bond energy is as low as 1.83 eV, whereas the Si—O bond of the $SiO_2$ film has a bond energy as high as 8.33 eV and the film is difficult to be etched with the low energy ions. The lowering of the self-bias may be possible by lowering the RF power. However, the degree of ionization of the plasma is lowered to reduce the amount of generated radicals, thus leading to a lowering of the etching rate. This makes efficient etching impossible. In contrast, according to the method of the invention wherein a high frequency of the RF power supply is used, the self-bias can be suppressed without lowering the etching efficiency. In the etching of the gate electrode with a chlorine etching gas, the selection ratio is about 10 when using known power sources capable of generating a high frequency of 13.56 MHz. Using a high frequency power supply of 100 MHz and a chlorine etching gas, the selection ratio reaches a value of not less than 40, thus making it possible to etch the gate electrode with little influence on the underlayer.

EXAMPLE 2

In this example, the dependence of the frequency of a RF power supply on the dielectric breakdown of a gate oxide film is described.

Figure 4:
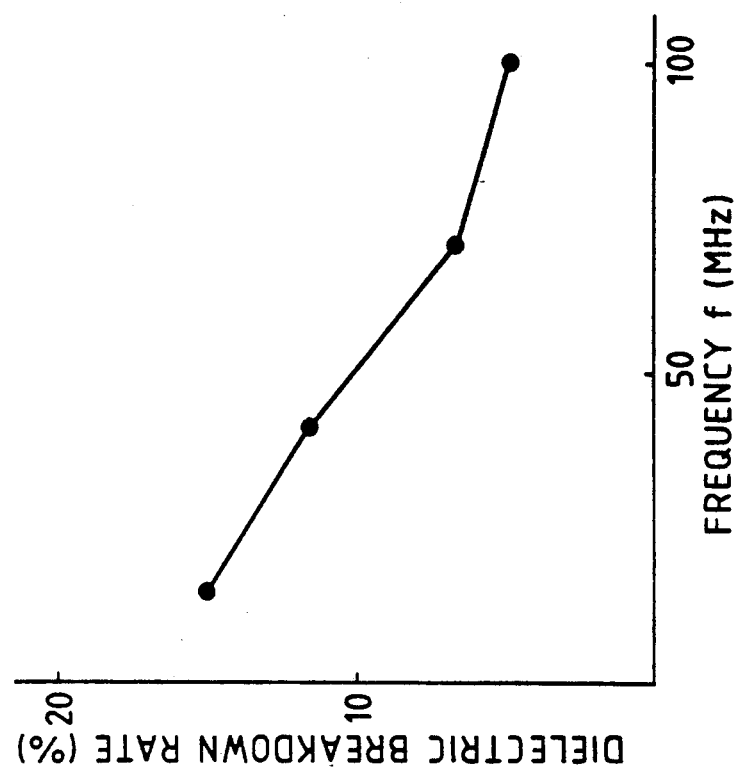
FIG. 4 is a graphical representation of the ratio in dielectric breakdown in relation to the variation of the frequency.

Four wafers were provided to subject polysilicon for gate electrode to etching while changing the frequency of the RF power supply at 13.56 MHz, 40 MHz, 70 MHz and 100 MHz. The etching was carried out using $Cl_2$ gas and etching conditions of a gas pressure of 300 mTorr., and RF power of 300 W. The four wafers were evaluated by FDDB (Field Dependent Dielectric Breakdown) with respect to the ratio of the chips whose gate oxide film suffered dielectric breakdown. The results are shown in FIG. 4, revealing that when the frequency of the RF power supply is increased, the rate of the chips which undergo dielectric breakdown is reduced. This is for the reason stated above: when the frequency is increased, the self-bias of the plasma is reduced to suppress generation of high energy ions and to reduce charge-up, thereby reducing the stress exerted on the gate electrode.

EXAMPLE 3

In this example, how to enhance anisotropy while suppressing generation of high energy ions is described.

The general procedure of Example 2 was repeated except that the gas pressure was changed to determine the variation of the self bias for different frequencies of 13.56 MHz, 40 MHz, and 100 MHz.

Figure 5:
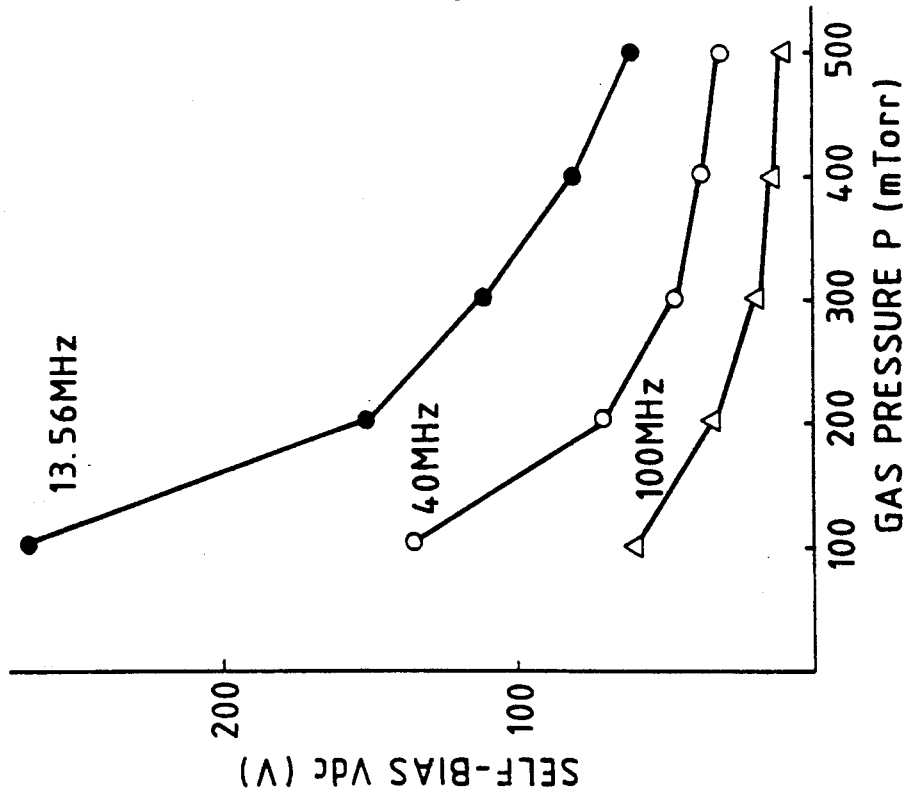
FIG. 5 is a graphical representation of the self-bias in relation to the variation of the gas pressure.

The results are shown in FIG. 5. In general, in order to enhance the anisotropy, it is sufficient to reduce an etching gas pressure. However, when the etching gas pressure is reduced, the self-bias is increased as shown in FIG. 5, so that high energy ions are generated. However, when the frequency is increased, the self-bias can be lowered, making it possible to ensure a desired degree of anisotropy.

From the results of Examples 1 to 3, it will be seen that when the frequency of the RF power supply is increased, the self-bias of the plasma is decreased, thereby not only suppressing the dielectric breakdown, but also increasing the selection ratio and a degree of anisotropy.

EXAMPLE 4

In this example, the dependence of the ion energy distribution on the frequency of a RF power supply is described.

Figure 6:
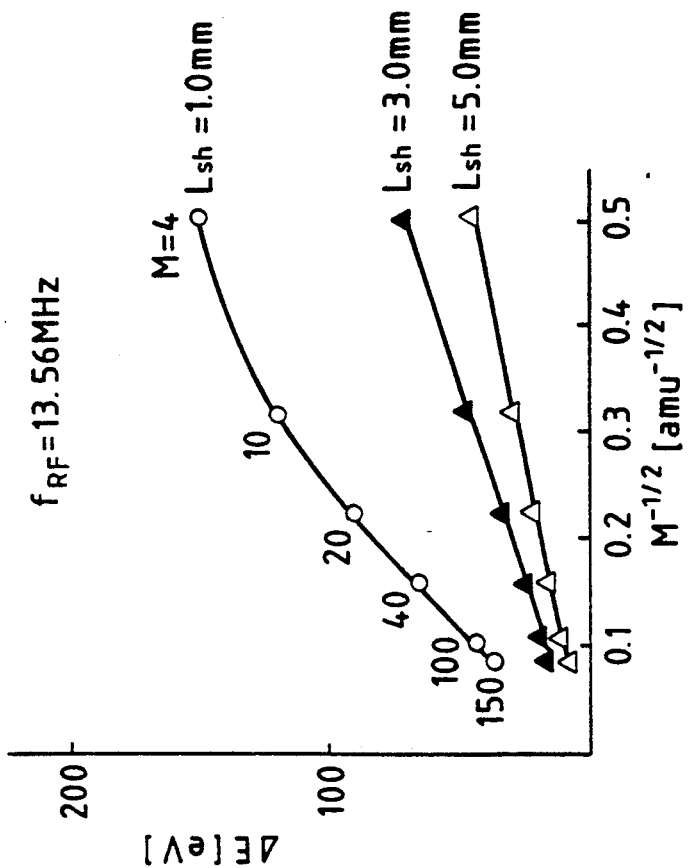
FIG. 6 is a graphical representation of the distribution width of ion energy in relation to the variation in the mass of an etching gas for different sheath lengths according to the Monte Carlo simulation method.
Figure 8:
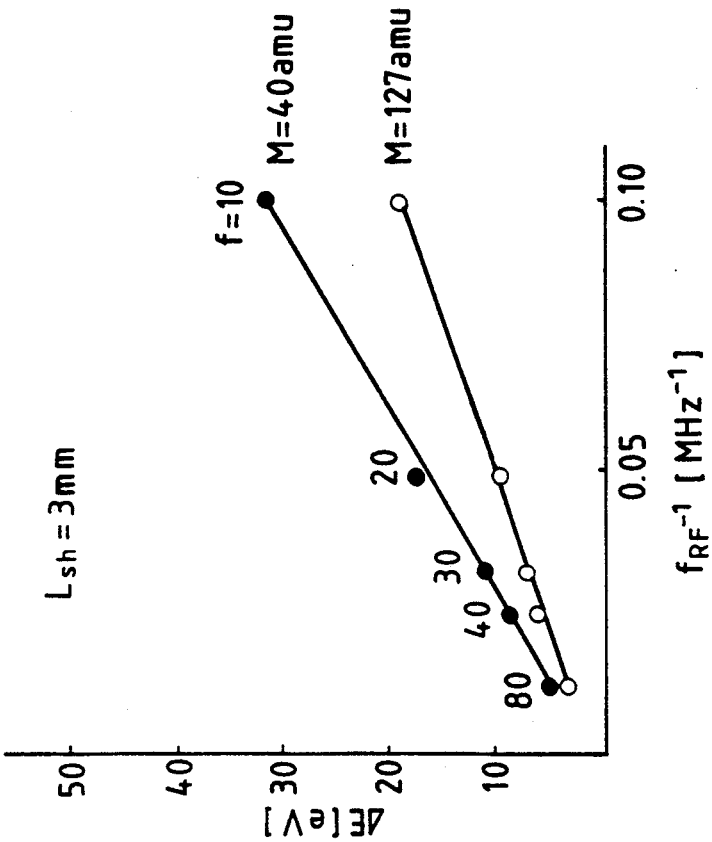
FIG. 8 is a graphical representation of the distribution width of ion energy in relation to the variation in the frequency of a power supply for different $L_{sh}$ according to the Monte Carlo simulation method.
Figure 7:
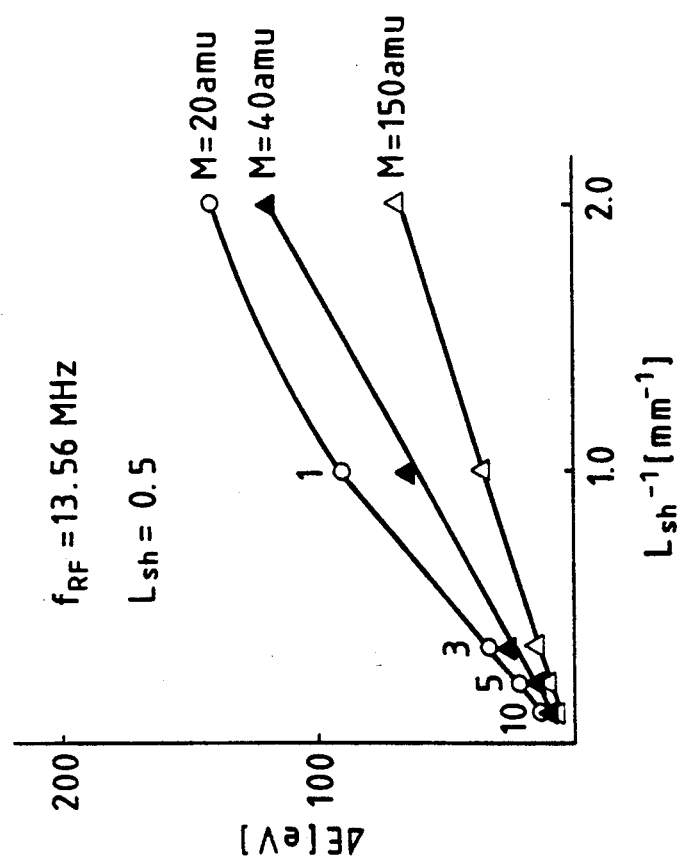
FIG. 7 a graphical representation of the distribution width of ion energy in relation to the variation in the sheath length, $L_{sh}$, for different masses of an etching gas according to the Monte Carlo simulation method.

The ion energy distribution was obtained by the use of the Monte Carlo simulation technique. FIG. 6 shows the dependence of a distribution width, $\Delta E$, of the ion energy distribution on $-\frac{1}{2}$nd power of the mass, M, of an etching gas for different sheath lengths, $L_{sh}$, wherein the frequency, $f_{RF}$, of a RF power supply is assumed to be 13.56 MHz. FIG. 7 shows the dependence of $\Delta E$ on the inverse number of the sheath length, $L_{sh}$, for different masses of etching gas in which the frequency, $f_{RF}$, of a RF power supply is assumed to be 13.56 MHz. Likewise, FIG. 8 shows the dependence of $\Delta E$ on the inverse number of $f_{RF}$ for different masses of etching gas, in which the sheath length, $L_{sh}$, is assumed to be 3 mm. In all the cases, plasma conditions include an ion temperature of 300° K. a self-bias of 100 V and a voltage of the RF power supply of 100 V. From FIGS. 6 to 8, it will be seen that the width, $\Delta E$, of the ion energy distribution is proportional to the $-\frac{1}{2}$nd power of the mass, M, of etching gas, the inverse number of the sheath length, $L_{sh}$, and the inverse number of the frequency, $f_{RF}$, of the RF power supply. More particularly, the width, $\Delta E$, of the ion energy distribution is expressed by the equation (1)

$$\Delta E = k/(M^{\frac{1}{2}} \cdot L_{sh} \cdot f_{RF}) \qquad (1)$$

wherein k is a proportionality factor. From FIGS. 6 to 8, the factor, k, is about 6830 eV·amu$^{\frac{1}{2}}$·mm·MHz. The reason why $\Delta E$ is proportional to $M^{-\frac{1}{2}} \cdot L_{sh}^{-1} \cdot f_{RF}^{-1}$ is considered as follows. When the mass, the sheath length or the frequency of the RF power supply is increased, the time of passage of the ions in the sheath region is prolonged. As a result, as set forth before, the ions are more accelerated by means of the RF power supply, so that the arrival energy of the ions at the substrate is not influenced by the incident phase but is concentrated at an average value (i.e. self-bias), thus causing the distribution width to be narrow.

If the distribution width of the ion energy is assumed to be ±5% of the self-bias, the tolerance of the energy width is within 10 eV. From the equation (1), the frequency, $f_{RF}$, of the RF power supply should satisfy the following inequation (2)

$$f_{RF} > 683/(M^{\frac{1}{2}} \cdot L_{sn}) \qquad (2)$$

For instance, when the sheath length is 3 mm, the frequency of the RF power supply should preferably be not less than 36 MHz for Ar$^+$ ions (M=40) and not less than 20 MHz for SF$_6^+$ ions (M=127).

Figure 9A:
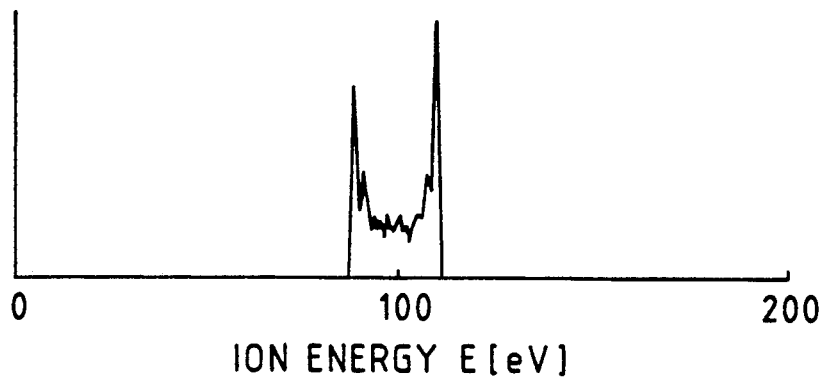
FIGS. 9a and 9b are, respectively, a graphical representation of an energy distribution of $Ar^+$ ions when the frequency of a RF power supply are, respectively, 13.56 MHz and 40.0 MHz.
Figure 9B:
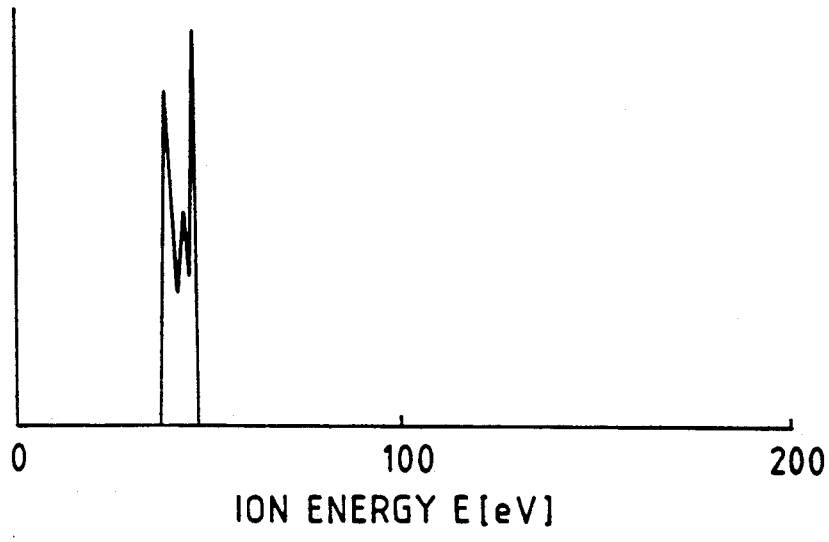

FIG. 9 shows an Ar$^+$ ion energy distribution in which FIG. 9a is for the frequency of 13.56 MHz and FIG. 9b is for the frequency of 40 MHz. In both cases, the sheath length is 3 mm. As will be apparent from FIGS. 9a and 9b, the increase of the frequency of the RF power supply results in a narrow width of the distribution wherein the ion energy is concentrated at a desired level (self-bias). The uniform ion energy distribution is obtained.

Thus, the use of a frequency higher than 13.56 MHz is effective in realizing dry etching in a damage-free and efficient manner since the ions are at a low energy level and have a uniform energy distribution.

As will be apparent from the foregoing description, according to the method of the invention using a high frequency RF power supply capable of generating a frequency higher than 13.56 MHz, the etching gas pressure can be reduced to lower the self-bias of the resultant plasma while keeping anisotropy. In addition, the ion energy distribution can be shifted toward a lower energy side as a whole and is made uniform while narrowing the width of the distribution within ±5% of an average arrival energy of the ions at substrates to be etched. Moreover, when a polysilicon, SiN or Al alloy layer formed on a SiO$_2$ film is etched, the etching is feasible at a high selection ratio while lowering the etching rate of the SiO$_2$ film.

What is claimed is:

1. A method for dry etching a multi-layer structure which includes an underlayer and an upper layer formed on a semiconductor substrate, said upper layer being more susceptible to etching than said underlayer, said method comprising the steps of:

providing a metallic chamber having a grounded anode and a cathode connected to a RF power supply, said anode and cathode being spaced from each other;

mounting said semiconductor substrate on said cathode;

feeding an etching gas into said metallic chamber at a reduced pressure;

applying a RF potential to said cathode from said RF power supply to generate a plasma between said anode and said cathode while setting a frequency of the RF power supply at a level greater than 13.56 MHz, so that a maximum energy of ions generated in said plasma which reach said semiconductor substrate is small enough to prevent said semiconductor from becoming damaged and a range of an energy distribution of said ions is narrow enough to allow selective etching of said upper layer to be etched while avoiding etching of said underlayer; and subjecting said upper layer to be etched to selective etching with the ions.

2. The method according to claim 1, wherein the frequency of said RF power supply is not smaller than 100 MHz so that the maximum energy of the ions which reach said semiconductor substrate is not larger than 100 eV and the range of the energy distribution is not larger than 10 eV.

3. The method according to claim 2, wherein the pressure of said etching gas is not greater than 100 mTorr.

4. The method according to claim 3, wherein said etching gas comprises a chlorine-based gas.

5. The method according to claim 4, wherein said upper layer to be etched is made of a member selected from the group consisting of polysilicon, SiN and Al alloy, and said underlayer is made of silicon dioxide.

6. The method according to claim 1, wherein the frequency, $f_{RF}$, is selected so that $f_{RF} > 683/(M^{\frac{1}{2}} \cdot L_{sn})$, wherein M represents a mass, in amu, of said etching gas and $L_{sn}$ represents a sheath length, in mm, and $f_{RF}$ represents the frequency of the RF power supply, in MHz.

7. The method according to claim 6, wherein the frequency is not smaller than 36 MHz when Ar gas is used as the etching gas.

8. The method according to claim 6, wherein the frequency is not smaller than 20 MHz when $SF_6$ is used as the etching gas.

9. The method according to claim 4, wherein said etching produces a gate electrode in said upper layer.

* * * * *